(12) United States Patent  
Williams

(10) Patent No.: US 7,439,746 B2
(45) Date of Patent: Oct. 21, 2008

(54) ELECTROSTATIC VOLTMETER

(75) Inventor: Bruce T. Williams, Barker, NY (US)

(73) Assignee: Trek, Inc., Medina, NY (US)

( * ) Notice: Subject to any disclaimer, the term of this patent is extended or adjusted under 35 U.S.C. 154(b) by 0 days.

(21) Appl. No.: 11/553,762

(22) Filed: Oct. 27, 2006

(65) Prior Publication Data
US 2008/0100300 A1  May 1, 2008

(51) Int. Cl.
G01R 29/12 (2006.01)
G01R 31/02 (2006.01)

(52) U.S. Cl. .......................... 324/458; 324/72

(58) Field of Classification Search ................ 324/458, 324/457, 72, 72.5, 99 D, 109, 158.1; 361/207; 73/514.16
See application file for complete search history.

(56) References Cited

U.S. PATENT DOCUMENTS

| 4,197,493 A | * | 4/1980 | Juve et al. ..................... 324/72 |
| 4,797,620 A | * | 1/1989 | Williams |
| 4,878,017 A | * | 10/1989 | Williams |
| 4,928,057 A | * | 5/1990 | Williams |
| 6,426,630 B1 | * | 7/2002 | Werner, Jr. .................. 324/458 |
| 6,433,552 B1 | * | 8/2002 | Williams ..................... 324/458 |
| 6,504,376 B2 | * | 1/2003 | Werner, Jr. .................. 324/458 |
| 7,098,644 B1 | * | 8/2006 | Denison .................... 324/72.5 |

OTHER PUBLICATIONS

International Search Report and Written Opinion for PCT/US2007/082705, filed May 2, 2008, Trek, Inc.*

* cited by examiner

*Primary Examiner*—Diego Gutierrez
*Assistant Examiner*—Hoai-An D Nguyen
(74) *Attorney, Agent, or Firm*—Hodgson Russ LLP

(57) ABSTRACT

An electrostatic voltmeter has an input sensing terminal, a first operational amplifier, a second operational amplifier, a first reference voltage terminal electrically connected to the non-inverting input of the second operational amplifier, a low reference voltage terminal electrically connected to the output of the second operational amplifier, and a voltage indicator, electrically connected between the low reference voltage terminal and the first reference voltage terminal.

17 Claims, 3 Drawing Sheets

ELECTROSTATIC VOLTMETER

FIELD OF THE INVENTION

The present invention relates to electrostatic voltmeters for contacting or non-contacting measurements.

BACKGROUND OF THE INVENTION

A challenge associated with electrostatic voltage metrology is to perform the measurement without disturbing the electrical state of the measured surface/object. This condition can only be accomplished by a device/instrument that has an input resistance of extremely high value, much higher than that of the measured electrostatic system/surface/object being measured. This high input resistance limits the amount of electric charge migrating between the measuring device and the object under test when performing contacting measurements.

Another factor influencing the measuring device's capability for electrostatic voltage measurement is the amount of input capacitance associated with the measurement device's input sensor circuitry, together with the parallel capacitance associated with any connection circuits to the sensor element. The detrimental effect that the input capacitance of the sensor has on electrostatic voltage measurements is with the electrical charge required to be supplied by the measured electrostatic object to drive the input capacitance of the sensor to the measured object's voltage level. The required charge transfer from measured object to sensor will alter the electrical state of the measured object.

Prior art contacting electrostatic voltmeters and devices, i.e., electrometers, typically feature an input capacitance of $1 \times 10^{-15}$ farad with input bias currents of $1 \times 10^{-15}$ amps with input resistances of $10^{15}$ ohms (see U.S. Pat. No. 3,870,968), and so they cannot be used successfully to perform contacting or noncontacting electrostatic voltage measurements without causing substantial distortion to the initial electrical state of the contacted measured object or producing measurement error when making noncontacting measurements. These prior art devices employ buffer amplifiers or operational amplifiers connected as unity gain follower amplifiers, which feature input bias currents in the order of $10^{-14}$ amps. If the input capacitance of these devices is lowered to a value in the order of $10^{-16}$ farads, the $10^{-14}$ input current would produce an uncontrollable input drift rate due to the input current providing a large source into the input capacitance to cause a large $$\frac{dv}{dt}$$

drift, where $$\frac{dv}{dt}$$

is the voltage change per unit time, and is equal to $$\frac{i}{c}$$

where i is the input current and c is the input capacitance, as conventionally known. Additionally, bias current levels of $10^{-14}$ amp will transfer a considerable amount of charge to a contacted measured object causing, again, distortion of the measured object voltage level.

The device described in U.S. Pat. No. 3,870,968 also suffers from other disadvantages. These disadvantages include:

1. As conventionally known, the connection of high gain operational amplifier circuitry, including integrated circuitry, as unity gain voltage followers introduces the common mode gain of the amplifier as a limitation on the open loop gain characteristic. An operational amplifier having an open loop gain characteristic of for example, 100 DB (gain=100,000) at DC operating as a single input summing amplifier, but having a common mode gain of 66 DB (gain=2,000) will result in a closed loop follower gain based upon the 66 DB gain when operated as a common mode amplifier, as in the case of U.S. Pat. No. 3,870,968. In addition, the common mode gain characteristic is highly dependent upon operating frequency and can fall to as little as 20 DB (gain=10) at as low a frequency as 10 kHz. As detailed in the cited prior art, the amplifier shown used as a voltage follower has a gain of about 66 DB (gain=2,000). The gain of 2,000 is not adequate to bootstrap the input resistance and capacitance to the $10^{17}$ ohm and $1 \times 10^{-17}$ farad respectively as required for contacting or noncontacting electrostatic voltmeter service. As will be shown, the invention of this disclosure addresses this issue by providing amplifier circuitry connection which eliminates the common mode operation of the follower connected amplifier, thus allowing the follower connection gain to be equal to the single ended gain characteristic of the amplifier of approximately 100 DB. At a follower connected gain of 100,000 (100 DB) rather than 2,000 (66 DB), the proper input characteristic for contacting or noncontacting electrostatic voltmeter service can be easily achieved. In addition, as the frequency characteristics of an amplifier operating in the common mode connection are considerably lower than the single ended connected operation, the frequency characteristic of the follower using the connection of this invention is much broader than the prior art device due to the bootstrapping of the follower power supply connection, as will be presently explained, thus reducing the various capacitances within the follower's internal circuitry as well as external circuitry, resulting in higher frequency operation capability.

2. The method used by the prior art device to eliminate charge from the input circuitry to cause it to return to a zero potential relative to ground is by use of a switch connecting the protective zener diodes which are connected between the follower's input and the output of an integrating amplifier whose input integrates the voltage differential between the follower output and ground, and then switching the protective zener diodes to be disconnected from the output of the integrating amplifier and reconnected to the follower output. As this technique may be useful when the follower input capacitance is on order of $10^{-15}$ farads as claimed by the prior art, at $10^{-17}$ farads, as obtained by the invention described herein, the charge transfer through the zener diodes upon switching the diodes between the integrator output and follower output, as used by the prior art device, produces a $$\frac{dv}{dt}$$

across the zener devices to inject a charge into the input where the charge $$\left(\text{``}\frac{dQ}{dt}\text{''}\right)$$

injected to the input circuit is equal to $$C\frac{dv}{dt},$$

where C is the capacitance of the series connected zener diodes connected to the input, and $$\frac{dv}{dt}$$

is the rate of voltage change at the integrator/output side of the zener diodes caused by switching the protective diodes between the integrator and the follower output. This charge transfer effect when zeroing the prior art device is eliminated by the instant invention.

3. Another disadvantage of the cited prior art device lays with the necessity to intentionally introduce a small voltage offset error between the voltage follower input and the follower output to correspondingly introduce a current into the voltage follower input through the first protective device that is equal to the first gate input current, see U.S. Pat. No. 3,870,968, claim 9. The operation of the follower of the instant invention does not require the introduction of a small voltage offset between the follower input and output, thereby allowing the output to be equal to and accurately follow the measured voltage of the input. In addition, to maintain very high equivalent input resistance, the voltage appearing across any resistive path associated with the input circuitry must be bootstrapped within microvolts of zero as provided by the output/input bootstrapping current of the instant invention, thereby negating the possible use of any intentional voltage offset there-between.

SUMMARY OF THE INVENTION

The invention may include an electrostatic voltmeter having an input sensing terminal, a first operational amplifier ("amplifier A1"), a second operational amplifier ("amplifier A2"), a first reference voltage terminal, a low reference voltage terminal and a voltage indicator. The amplifier A1, may have a non-inverting input, an inverting input and an output, the non-inverting input being electrically connected to the input sensing terminal, and the inverting input being electrically connected to the output to create a voltage follower. Amplifier A2 may have a non-inverting input, an inverting input and an output, the inverting input being electrically connected to the output of the amplifier A1, and being electrically connected via a capacitor to the output of the amplifier A2.

The first reference voltage terminal may be electrically connected to the non-inverting input of the amplifier A2, and the low reference voltage terminal may be electrically connected to the output of the amplifier A2. The voltage indicator may be electrically connected between the low reference voltage terminal and the first reference voltage terminal.

BRIEF DESCRIPTION OF THE DRAWINGS

For a fuller understanding of the nature and objects of the invention, reference should be made to the accompanying drawings and the subsequent description. Briefly, the drawings are.

FURTHER DESCRIPTION OF THE INVENTION

An embodiment of the invention is described herein which may provide one or more of the following advantages:
1. input capacitance of less than $1 \times 10^{-17}$ farads
2. input bias current of less than $1 \times 10^{-19}$ amps
3. measurement bandwidth of greater than 50 kHz
4. a method of initializing the voltage level of the follower's input circuitry at zero volts to prevent charge transfer to/from the measured object upon initial contact, the zeroing method avoiding an offset voltage jump shift at the input upon release of the zeroing circuitry devices.
5. a method to produce nullification of the follower's input bias current and/or other leakage currents without the requirement to intentionally generate a voltage offset between the follower's input and output thus preventing current flow to the input capacitance when making non-contacting measurements, or current flow to the measured object when making contacting measurements.
6. an easy-to-use, portable measurement tool for making accurate contacting and noncontacting electrostatic voltage measurement.

Figure 1:
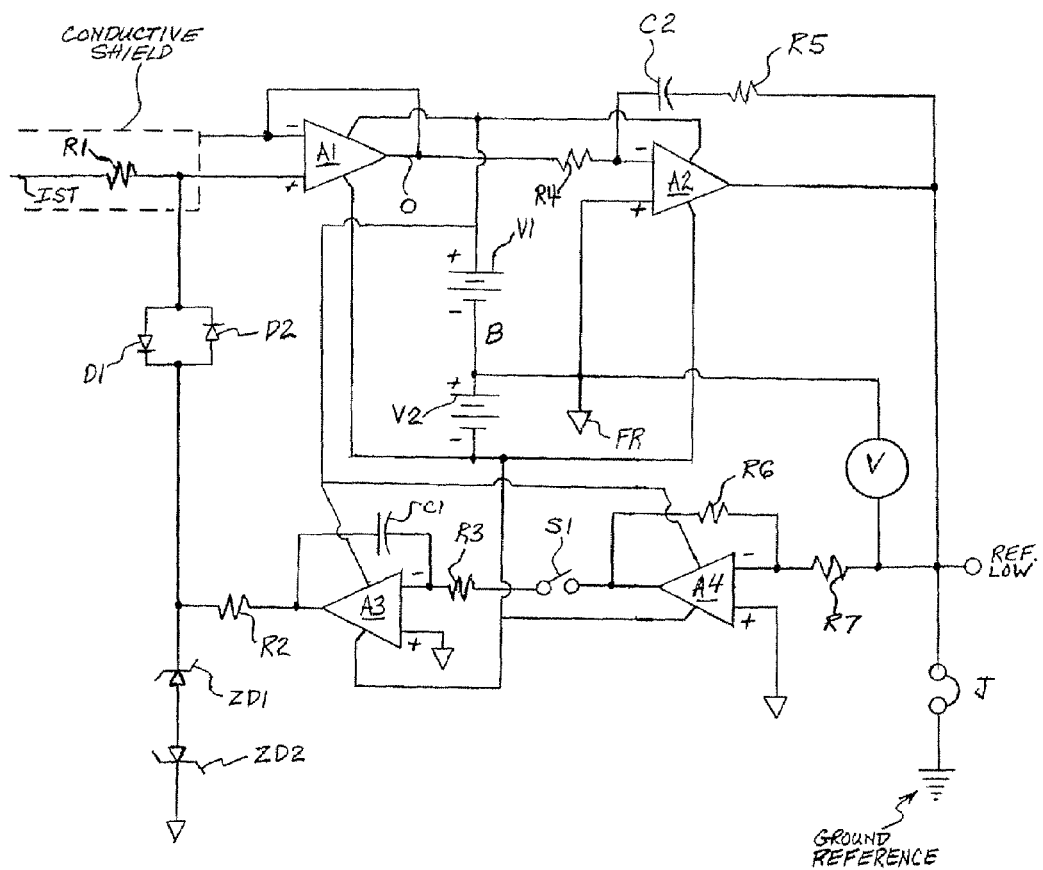
FIG. 1, which is a schematic representation of a voltmeter according to the invention.

Shown in FIG. 1 is a simplified schematic representation of an embodiment of the invention. Amplifier A1 may be a commercially available electrometer grade operational amplifier, having an input bias current of $10^{-14}$ amps and an input capacitance of $3 \times 10^{-12}$ farad. Amplifier A1 may be connected as a unity gain voltage follower by connection of its output O to its inverting input, as conventionally known. The input sensing terminal IST may be connected to the non-inverting input of amplifier A1 via resistor R1, which may be an input surge voltage-limiting resistor of approximately $10^9$ to $10^{12}$ ohms. The non-inverting input of amplifier A1 may also be connected to low leakage/low capacitance diodes D1, D2, which protect amplifier A1 from voltage excesses.

Also shown is a conductive shield guarding the input circuitry and electrically connected and driven by the follower's output O. The conductive shield may be made from any metallic or non-metalic electrically conductive material.

Operational amplifier bias voltage supplies V1 and V2 may be connected to the amplifier A1 power supply terminal as well as the other amplifiers A2, A3 power supply terminals and may be +15 and −15 volts for V1 and V2 respectively. The common connection of the V1 and V2 supplies at "B" may be connected to the floating reference FR terminal.

Components R4, R5, and C2 are used to maintain system stability with high system bandwidth and good transient response. In one embodiment of the invention, R4, R5, and C2 are 10 kΩ, 8 kΩ, and 68 pF respectively to obtain good high frequency measurement response. In the case where amplifiers A1, A2 are of very high bandwidth capability, different values of R4, R5, and C2 may be appropriate.

Amplifier A2 has its input connected between the output O and the floating reference FR, and the output of amplifier A2 is connected to ref. low or ground reference. If a voltage difference appears between output O and the floating reference FR, amplifier A2 will drive the potential of the floating reference FR to match and follow with high accuracy the potential at the output O of follower A1. As potential O is equal to the potential of the non-inverting input terminal of the follower amplifier A1, the potential FR will be bootstrap driven to match and follow the potential at the A1 follower's non-inverting input, which is the measured voltage. The common connection of the bias supplies at the floating reference FR will cause the bias supplies also to be bootstrapped to the floating reference FR potential level. For example, if the voltage at the A1 follower input is zero volts, the output of the follower will be zero, and if the floating reference FR is different from zero, amplifier A2 will drive the potential of the floating reference FR to zero, and consequently the bias voltages applied to the A1 follower will be +15 and −15 volts. If +10 volts is now applied to the A1 follower input, the amplifier A1's input and output will go to +10 volts, while the +15 and −15 volt bias supplies will go to +25 and −5 volts respectively, thus all terminals of the A1 follower are bootstrap driven to follow the input voltage of the follower A1 with very high accuracy due to the gain characteristic of amplifier A2.

The follower does not experience a common mode voltage change as a function of the input voltage as does the prior art device, and so the high voltage gain and bandwidth characteristics of the follower amplifier A1 are preserved to cause the bootstrapping of the input capacitance and resistance to be driven and maintained at the desired value over the entire voltage range applied to the input sensing terminal IST. It should be noted that the amplifier A2 also does not experience a common mode voltage change as well, thus maintaining its single ended operation high gain and bandwidth characteristics.

To read the input sensing terminal IST voltage applied to the follower A1, an indicator device V, which may be a voltmeter or data processing device can be connected between the floating common and the ref. low connection, which could be a ground reference or another reference potential other than ground. For example, if differential electrostatic voltage measurements are required, the ref. low connection could be driven by the floating reference FR connection of a second follower circuit as that shown in FIG. 1. The second follower circuit could be similar to the follower circuit having the amplifier A1.

The operation of an input zeroing method according to this invention will now be described. The input zeroing method removes residual charge appearing across the input capacitances of the follower A1 to cause the input sensing terminal IST voltage to go to zero, or in the case of the use of a potential other than zero that is connected to the ref. low terminal. Op-amp A3 is an integrating operational amplifier with integrating capacitor C1. An integrating current source may be produced by the output voltage of amplifier A4 (an inverting amplifier) divided by the resistance of resistor R3. This current source is available when the zero switch S1 is closed. Diodes D1 and D2, may be low leakage/low capacitance diodes, may be connected between the follower A1 input and the output of integrator A3 through resistor R2, a current limiting resistor. Also connected to the diodes D1 and D2 may be zener diodes ZD1 and ZD2. Zener diodes ZD1, ZD2, acting with D1, D2, may serve to protect the follower A1 against a voltage applied to the input sensing terminal IST which exceeds the input voltage level capability of the follower A1, which may be approximately ±11 volts.

As conventionally known, low leakage, low capacitance diodes D1 and D2 operating in the nonconducting region in the voltage range of 20 to 50 millivolts display an equivalent resistance of $10^{13}$ to $10^{14}$ ohms around room temperature. In addition, the capacitance of each of these diodes is typically 0.5 picofarads, for a total of 1.0 picofarad, which adds in parallel to the 3.0 picofarads already existing due to the normally specified input capacitance of amplifier A1.

Once the zero switch S1 is closed, if the output of the follower A1 is not zero, as indicated by the voltage monitoring device V, the non-zero offset voltage will appear inverted at the output of A4 in reference to the floating reference FR to produce an integrating current through R3 to cause a voltage to appear across C1 and at the output of amplifier A3. The A3 output voltage will produce a current through D1 or D2, depending on the polarity of the output voltage of amplifier A3, to remove any residual charge across the input capacitance of the follower A1 input. However, after the residual charge has been removed, a small voltage will remain at the integrator A3 output, this voltage being equal to the follower A1 amplifier bias current of approximately $10^{-14}$ amps times the resistance of D1 or D2, which may be $10^{13}$ to $10^{14}$ ohms, as earlier explained. Thus the output of the integrator amplifier A3 will quickly produce those voltage values necessary to first, remove the charge on the follower's A1 input capacitance, and second, to produce an equal and opposite current to effectively neutralize the input current of the follower A1 and to prevent charging of the follower's A1 input capacitance and/or producing current flow into the electrostatic object to which the input sensing terminal IST may be connected for measurement.

When the zeroing is completed, the zero switch S1 may be opened and the voltage at the output of integrator A3 remains at the value present just before the switch S1 is opened, as conventionally known for the operation of integrating amplifier circuitry. In addition, with switch S1 open, the voltage at the output of amplifier A3 will be the sum of the voltage applied to the non-inverting input of integrating amplifier A3 and the stored value of voltage across capacitor C1. Due to the connection of the non-inverting terminal of amplifier A3 to the floating reference FR, the output of amplifier A3 will accurately follow the voltage of the floating reference FR while maintaining the offset voltage due to the stored charge on C1. In this way, the current required to cancel the input bias current of amplifier A1 will be maintained throughout the voltage measuring range while the zero switch S1 is opened. In addition, because the voltage at the output of amplifier A3 faithfully follows with high accuracy the voltage present at the floating reference FR, diodes D1, D2 will be effectively bootstrapped to the voltage of the floating reference FR, thus capacitance of the diodes D1, and D2 will be driven to a very low capacitance with very high impedance, yet will provide the required voltage offset, as provided by the stored charge across capacitor C1, to nullify the input bias current of the follower A1. It may be noted that, due to the voltage at the floating reference FR being driven by the amplifier A2 circuitry to precisely follow the voltage at the output of the follower A1 with high accuracy due to the high gain of amplifier A2, the non-inverting input of amplifier A3 could also be connected to the output O of the follower A1 for good results in the bootstrapping of D1 and D2 by the output of amplifier A3.

During the subsequent measurement period (after zero switch S1 is opened), the amplifier A1 bias current continues to be cancelled. In those applications where the zeroing function may be repeated several times per hour, the use of a good quality integrating amplifier A3 with a low leakage integrating capacitor C3 should be adequate. However, if longer periods between zero function actuations is required, the use of an integrating amplifier, together with a solid-state or other type of non-drifting digital voltage memory function could be used.

The use of the integrator amplifier A3 and/or other electronic data storage devices (if required) used in the manner described by this disclosure removes disadvantages of the prior art device by eliminating the need to switch the input protection devices between a zeroing integrator and the follower output. In addition, an undesirable intentional offset voltage between the follower amplifier A1 input and output does not have to be produced to achieve input bias current cancellation.

The voltage measurement range of the device of FIG. 1 is limited by the voltages provided by the bias supplies V1, V2. For example, if the bias supplies V1, V2 are +15 and −15 volts respectively, the voltage range of the device might be approximately −12 to +12 volts. The values of the bias supplies V1, V2 could be changed to provide a unipolar range or different voltage range bipolar operation as limited by the maximum bias levels permissible by amplifiers A1, A2, and A3, whether discreet or integrated circuitry is used.

Figure 2:
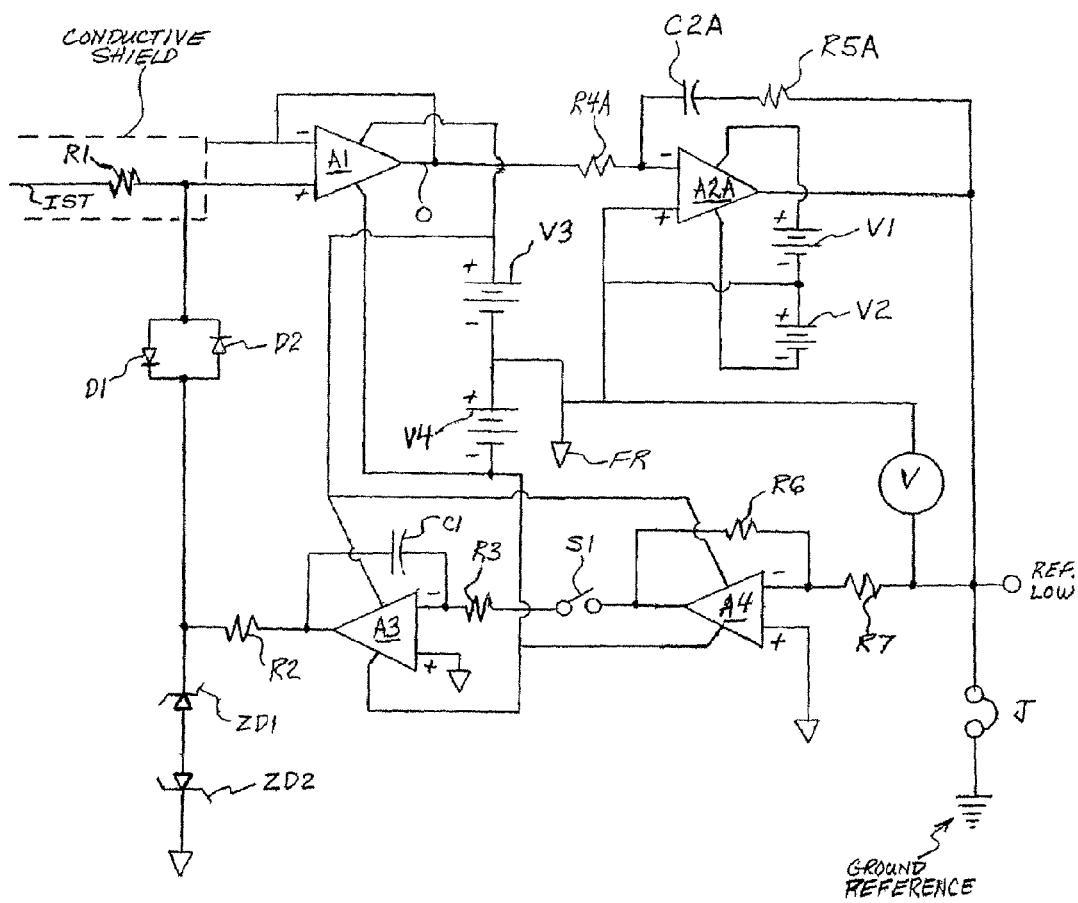
FIG. 2, which is a schematic representation of another voltmeter according to the invention.

To provide unipolar or bipolar voltage ranges into the hundreds of volts or more, it may be necessary to provide a pair of high voltage bias supplies to the amplifier A2, and of course a high voltage amplifier A2 and associated circuitry. FIG. 2 depicts an electrostatic voltmeter similar to that of FIG. 1 except that amplifier A2 is configured for high voltage bipolar operation. Here amplifier A2 is a high voltage operational amplifier A2A, having dynamics controlling elements R4A, R5A, and C2A. The bias supplies V1, V2 may provide bias voltage levels to amplifier A2A that are slightly above the desired bipolar range of the electrostatic voltmeter. Unipolar operation could be achieved, for example, by having the bias supplies V1, V2 provide a range of −12 V to +HV (where "HV" stands for a desired high voltage), by eliminating V1 and returning the positive bias supply connection of amplifier A2A to bias supply V3 and making the potential of bias supply V2 slightly above the desired +HV range value. Other connections relative to amplifier A1 and bias supplies V1, V2 could be made to achieve high voltage operation, as is conventionally known.

The circuitry of the device shown in FIG. 1 and FIG. 2 therefore achieves many benefits not realized by the prior art. For contacting measurements, the input sensing terminal IST may be fitted with an appropriate contact element/pin to allow the input sensing terminal IST to make contact to various systems, surfaces, and objects. The high input resistance, together with the low input capacitance and near zero input current of a device according to the invention, would allow precision contact measurements with very low disruption/distortion of the initial electrical state of the measured object. An advantage of a device according to the invention may be that it has an extremely low input capacitance, which may be beneficial in making noncontacting electrostatic voltage measurements. As the input sensing terminal IST of the device approaches the surface or object to be measured, the capacitance there-between increases. When the capacitance reaches a value of, for example, $10^{-14}$ farads, the ultra low input capacitance of $10^{-17}$ farads will be charged to the electrostatic voltage of the object with an error of approximately 0.1% as conventionally known. As $10^{-14}$ farads is a fairly small capacitance and can be easily obtained at relatively close spacing to a small area sensing surface connected to the input sensing terminal IST, high spatial resolution noncontacting electrostatic voltage measurement can be made using a device according to the invention.

Figure 3:
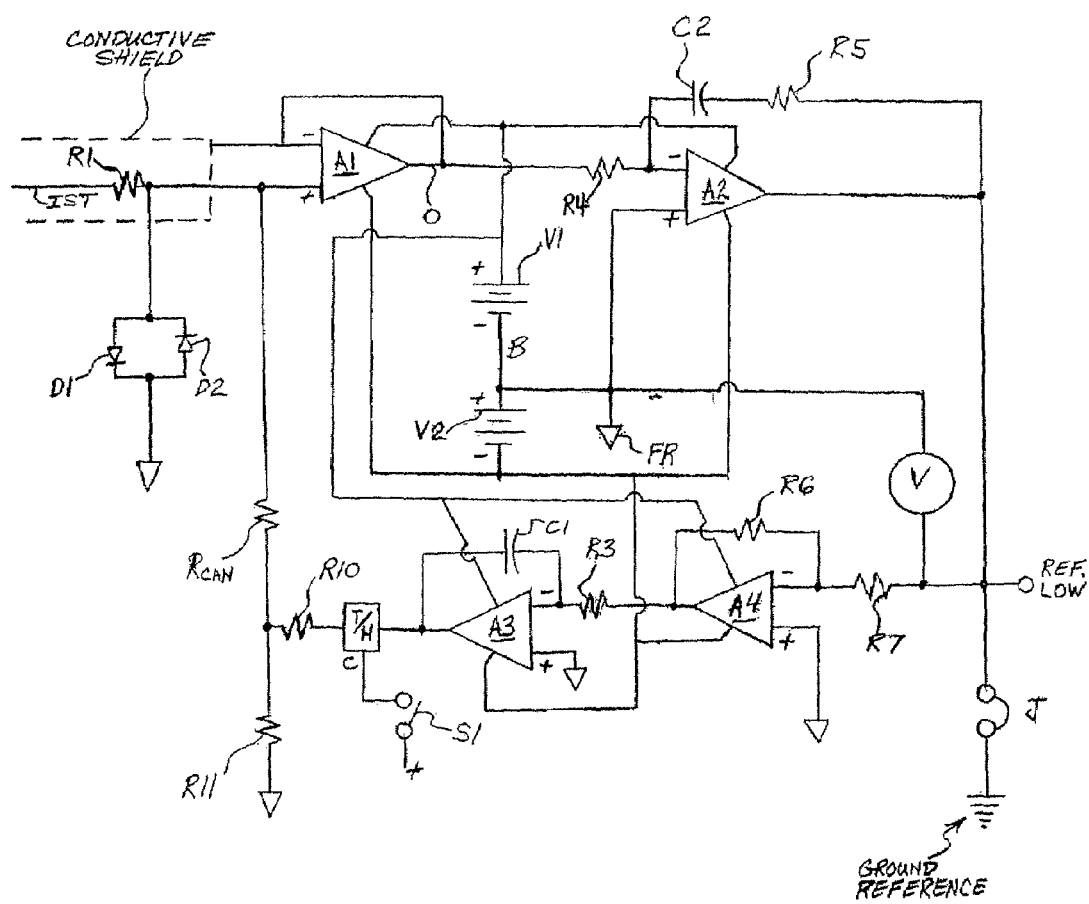
FIG. 3, which is a schematic representation of another voltmeter according to the invention.

In the case where the embodiment of FIG. 1 uses an amplifier A1 which itself has input voltage protection devices which protect amplifier A1 against transients/over voltages, thus negating the need for diodes D1, D2, ZD1, ZD2 to provide the protection, those diode components D1, D2, ZD1, ZD2 can be eliminated and the input bias cancellation current will be supplied by a high resistance value resistive element (Rcan) connected between the output of amplifier A3 and the non-inverting input of amplifier A1, as shown in FIG. 3. FIG. 3 is a schematic representation of an embodiment of the invention. Here the low leakage/low capacitance diodes D1, D2 are shown protecting the input of amplifier A1 against over voltage/voltage transients. These diodes could also be low leakage/low capacitance zener diodes. They would not be used if amplifier A1 already provides voltage transit/over voltage protection, for example via an on-chip structure. As the input bias current of amplifier A1, as well as leakage current associated with the amplifier A1 input circuitry, typically vary with temperature at a rate of approximately doubling every $10^0$ C rise in temperature, the voltage applied to the amplifier A3 end of current canceling resistor Rcan has temperature compensating resistive components R10, R11 (or Rcan itself can be temperature sensitive) to provide currents into the input of amplifier A1 through Rcan which are temperature sensitive to provide the amplifier A1 input bias current and other leakage current cancellation over a wide range of temperatures.

If resistor R10 or resistor Rcan is made to compensate for the temperature sensitive leakage current, their resistance versus temperature characteristic may be such to increase the compensating current delivered to amplifier A1 as temperature rises. If resistor R11 is the temperature compensating element, its resistance versus temperature characteristic may be such to increase the compensating current delivered to amplifier A1 as temperature rises. Also shown in FIG. 3 is a track to hold (T/H) element whose function is to produce a voltage at its output which exactly matches and follows the voltage at its input when the zero switch S1 applies a "track" command to its control terminal C. When the zero switch S1 is opened to give a "hold" command, the output of the T/H element will remain fixed and without drift at the voltage output value present at the instant of the "hold" command. The T/H element is a well known circuit element. With the T/H element placed between amplifier A3 and the input to the leakage current canceling resistive network (or Rcan) the required voltage value necessary to achieve input bias to amplifier A1 is stored, the requirement of amplifier A3 and capacitor C1 to hold the required voltage value is eliminated and the required voltage can be held effectively at the output of the T/H element.

When the invention of this disclosure is used for non-contacting voltage measurements on objects and surfaces, the probe tip can be coated with a thin insulating material to prevent current flow to/from the measured object or surface. This thin insulating coating such as an anodized aluminum layer or thin-material such as Teflon will provide a non-ohmic contact having a good capacitive coupling between the input sensing terminal IST and object/surface under test. As disclosed, a surface-to-tip capacitance of as little as $10^{-15}$ farads will provide the coupling necessary to drive the $10^{-17}$ farad input capacitance of this voltmeter to within 1% of the actual surface voltage.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An electrostatic voltmeter, comprising:
   an input sensing terminal;
   a first operational amplifier ("amplifier A1") having a non-inverting input ("non-inverting input A1"), an inverting input ("inverting input A1") and an output ("output A1"), the non-inverting input A1 being electrically connected to the input sensing terminal, and the inverting input A1 being electrically connected to the output A1 to create a voltage follower;
   a second operational amplifier ("amplifier A2") having a non-inverting input ("non-inverting input A2"), an inverting input ("inverting input A2") and an output ("output A2"), the inverting input A2 being electrically connected to the output A1, and being electrically connected via a capacitor to the output A2;
   a first reference voltage terminal electrically connected to the non-inverting input A2;
   a low reference voltage terminal electrically connected to the output A2;
   a voltage indicator, electrically connected between the low reference voltage terminal and the first reference voltage terminal;
   an inverting operational amplifier ("amplifier A4") having an inverting input ("inverting input A4"), a non-inverting input ("non-inverting input A4") and an output ("output A4"), the inverting input A4 being electrically connected to the low reference voltage terminal, and the non-inverting input A4 being electrically connected to the first reference voltage terminal; and
   a first voltage source ("source V1") and a second voltage source ("source V2"), source V1 and source V2 being arranged in series and the first reference voltage terminal being electrically located between source V1 and source V2; and
   a third voltage source ("source V3") and a fourth voltage source ("source V4"), wherein source V3 and source V4 being arranged in series and the first reference voltage terminal being electrically located between source V3 and source V4.

2. The electrostatic voltmeter of claim 1, wherein a low potential power supply terminal of amplifier A1 is electrically connected to a low potential terminal of source V4.

3. The electrostatic voltmeter of claim 2, further comprising an integrating operational amplifier ("amplifier A3") having an inverting input ("inverting input A 3"), a non-inverting input ("non-inverting input A3") and an output ("output A3"), the inverting input A3 being electrically connected to the output A4 and the non-inverting input A3 being electrically connected to the first reference voltage terminal.

4. The electrostatic voltmeter of claim 3, further comprising a switch electrically located between the output A4 and the inverting input A3.

5. The electrostatic voltmeter of claim 1, further comprising an electrically conductive shield surrounding the input sensing terminal and electrically connected to the output A1.

6. The electrostatic voltmeter of claim 1, wherein a high potential power supply terminal of amplifier A1 is electrically connected to a high potential terminal of source V3.

7. The electrostatic voltmeter of claim 1, wherein a high potential terminal of source V2 is electrically connected to a low potential terminal of source V1.

8. The electrostatic voltmeter of claim 1, wherein high potential power supply terminals of amplifier A1 and amplifier A2 are electrically connected to a high potential terminal of source V1.

9. The electrostatic voltmeter of claim 8, further comprising an integrating operational amplifier ("amplifier A3") having an inverting input ("inverting input A3"), a non-inverting input ("non-inverting input A3") and an output ("output A3"), the inverting input A3 being electrically connected to the output A4 and the non-inverting input A3 being electrically connected to the first reference voltage terminal, and wherein a high potential power supply terminal of amplifier A3 is electrically connected to the high potential terminal of source V1.

10. The electrostatic voltmeter of claim 1, wherein low potential power supply terminals of amplifier A1 and amplifier A2 are electrically connected to a low potential terminal of source V2.

11. The electrostatic voltmeter of claim 10, further comprising an integrating operational amplifier ("amplifier A3") having an inverting input ("inverting input A3"), a non-inverting input ("non-inverting input A3") and an output ("output A3"), the inverting input A3 being electrically connected to the output A4 and the non-inverting input A3 being electrically connected to the first reference voltage terminal, and wherein a high potential power supply terminal of amplifier A3 is electrically connected to a high potential terminal of source V1.

12. The electrostatic voltmeter of claim 1, wherein a high potential terminal of source V4 is electrically connected to a low potential terminal of source V3.

13. The electrostatic voltmeter of claim 1, further comprising an integrating operational amplifier ("amplifier A3") having an inverting input ("inverting input A3"), a non-inverting input ("non-inverting input A3") and an output ("output A3"), the inverting input A3 being electrically connected to the output A4 and the non-inverting input A3 being electrically connected to the first reference voltage terminal, and wherein a low potential power supply terminal of amplifier A3 is electrically connected to the low potential terminal of source V4.

14. The electrostatic voltmeter of claim 1, further comprising an integrating operational amplifier ("amplifier A3") having an inverting input ("inverting input A3"), a non-inverting input ("non-inverting input A3") and an output ("output A3"), the inverting input A3 being electrically connected to the output A4 and the non-inverting input A3 being electrically connected to the first reference voltage terminal, and wherein a high potential power supply terminal of amplifier A3 is electrically connected to a high potential terminal of source V3.

15. The electrostatic voltmeter of claim 1, wherein a low potential power supply terminal of amplifier A2 is electrically connected to a low potential terminal of source V2.

16. The electrostatic voltmeter of claim 1, wherein a high potential terminal of source V2 is electrically connected to a low potential terminal of source V1.

17. The electrostatic voltmeter of claim 1, wherein a high potential power supply terminal of amplifier A2 is electrically connected to a high potential terminal of source V1.

* * * * *

UNITED STATES PATENT AND TRADEMARK OFFICE
CERTIFICATE OF CORRECTION

PATENT NO. : 7,439,746 B2
APPLICATION NO. : 11/553762
DATED : October 21, 2008
INVENTOR(S) : Bruce T. Williams It is certified that error appears in the above-identified patent and that said Letters Patent is hereby corrected as shown below:

At Column 9, lines 51-57, claim 3 should be rewritten as follows:

--3. The electrostatic voltmeter of claim 1, further comprising an integrating operation amplifier ("amplifier A3") having an inverting input ("inverting input A3"), a non-inverting input ("non-inverting input A3") and an output ("output A3"), the inverting input A3 being electrically connected to the output A4 and the non-inverting input A3 being electrically connected to the first reference voltage terminal.--

Signed and Sealed this
First Day of January, 2013

David J. Kappos
*Director of the United States Patent and Trademark Office*